United States Patent
Parker et al.

(10) Patent No.: US 7,307,222 B2
(45) Date of Patent: Dec. 11, 2007

(54) PRINTED CIRCUIT BOARD TEST ACCESS POINT STRUCTURES AND METHOD FOR MAKING THE SAME

(75) Inventors: Kenneth P. Parker, Ft. Collins, CO (US); Ronald J. Peiffer, Loveland, CO (US); Glen E. Leinbach, Ft. Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 519 days.

(21) Appl. No.: 10/670,649

(22) Filed: Sep. 24, 2003

(65) Prior Publication Data
US 2005/0061540 A1 Mar. 24, 2005

(51) Int. Cl.
*H01R 12/04* (2006.01)
*H05K 1/11* (2006.01)
*G01R 31/02* (2006.01)

(52) U.S. Cl. ............................ 174/261; 324/763

(58) Field of Classification Search ............ 324/763, 324/537; 174/261
See application file for complete search history.

(56) References Cited

U.S. PATENT DOCUMENTS

| | | | |
|---|---|---|---|
| 5,416,274 A * | 5/1995 | Ushiyama et al. ........... 174/250 |
| 5,680,056 A * | 10/1997 | Ito et al. ...................... 324/750 |
| 6,686,758 B1 * | 2/2004 | Farnworth et al. .......... 324/765 |
| 2001/0002728 A1* | 6/2001 | Tsukada et al. ............. 257/693 |
| 2004/0150388 A1* | 8/2004 | Cheng et al. ............. 324/158.1 |

* cited by examiner

Primary Examiner—Jeremy C Norris (57) ABSTRACT

A test access point structure for accessing test points of a printed circuit board and method of fabrication thereof is presented. In an x-, y-, z-coordinate system where traces are printed along an x-y plane, the z-dimension is used to implement test access point structures. Each test access point structure is conductively connected to a trace at a test access point directly on top of the trace and along the z axis of the x-, y-, z-coordinate system above an exposed surface of the printed circuit board to be accessible for electrical probing by an external device.

6 Claims, 9 Drawing Sheets

PRINTED CIRCUIT BOARD TEST ACCESS POINT STRUCTURES AND METHOD FOR MAKING THE SAME

BACKGROUND OF THE INVENTION

In-circuit testers (ICT) have traditionally used "bed-of-nails" (BON) access to gain electrical connectivity to circuit wiring (traces, nets, pads) for control and observation capability needed for testing. This necessitates having access points within the layout of circuit nets that can be targets for ICT probes. Test access points are usually circular targets with 28 to 35 mil diameter that are connected to traces on the printed circuit board. In some cases these targets are deliberately added test pads, and in other cases the targets are "via" pads surrounding vias already provided in the printed circuit.

Lower diameter targets are increasingly difficult to hit reliably and repeatably, especially when a test fixture may contain several thousand such probes. It is always desirable to use larger diameter targets, but this is in fundamental conflict with the industry trend towards higher densities and smaller geometry devices.

Yet another industry trend is to use higher and higher speed logic families. One Megahertz (MHz) designs became ten MHz designs, then 100 MHz designs, and are now reaching the Gigahertz domain. The increases in logic speed necessitates industry attention to board layout rules for higher-speed interconnects. The goal of these rules is to create a controlled impedance pathway that minimizes noise, crosstalk and signal reflections.

Figure 1:
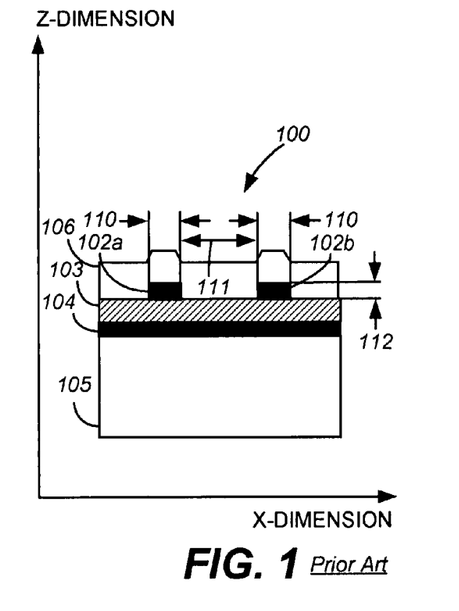
FIG. 1 is a cross-sectional side view of a conventional printed circuit board with differential signal traces showing the x- and z-dimensions in the x-, y-, z-coordinate system.

The preferred way of transmitting high-speed data is through differential transmission signals. FIG. 1 illustrates the important layout parameters for a classic pair of differential transmission signal traces 102a, 102b on a portion of a printed circuit board 100. As illustrated, the printed circuit board 100 is formed as a plurality of layers. In the illustrative embodiment, the printed circuit board 100 includes a ground plane 104 layered over a substrate 105, a dielectric 103 layered over the ground plane 104, traces 102a, 102b layered over the dielectric 103, and a solder mask 106 layered over the traces 102a, 102b and exposed surfaces of the dielectric 103. In such a layout, there are a number of critical parameters that affect the impedance of the signal path. These parameters include trace width 110, trace separation 111, trace thickness 112, and dielectric constants of the solder mask and board material. These parameters influence the inductance, capacitance, and resistance (skin effect and DC) of the traces which combine to determine the transmission impedance. It is desired to control this value across the entire run of each trace 102a, 102b.

Figure 2A:
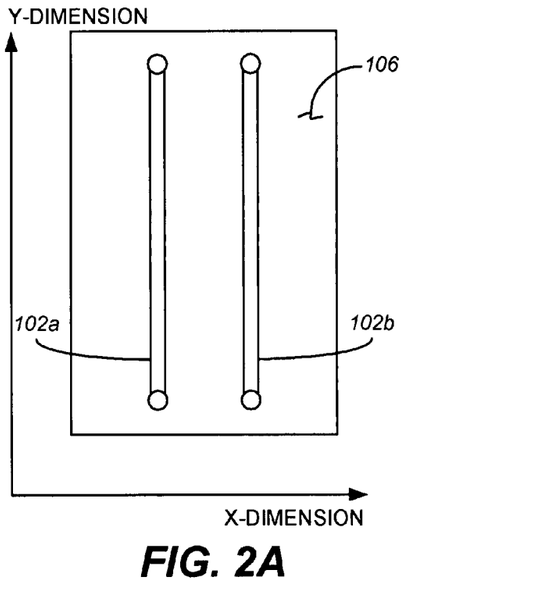
FIG. 2A is a top view of the printed circuit board of FIG. 1 showing the x- and y-dimensions of the differential signal traces in the x-, y-, z-coordinate system.
Figure 2B:
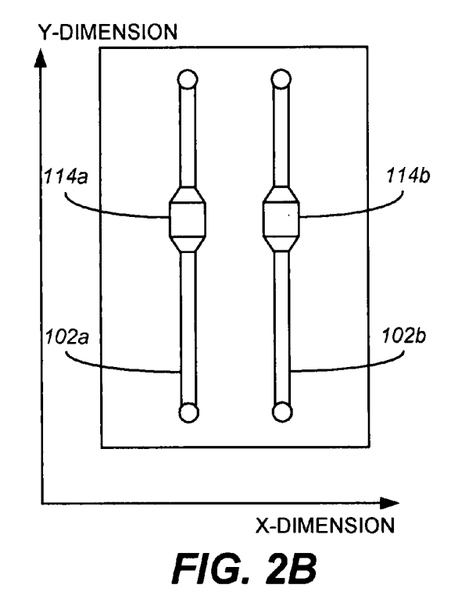
FIG. 2B is a top view of a printed circuit board showing the x- and y-dimensions in the x-, y-, z-coordinate system of a pair of differential signal traces with capacitors.

In higher speed designs it is also important to control the symmetry of the traces. Ideally, both paths 102a, 102b would be identical in length, as shown in FIG. 2A. However, routing signals on a crowded printed circuit board necessitates curves and bends in the path, which makes matching lengths and symmetries more difficult. In some cases, series components (such as series terminations or DC blocking capacitors) must be included in the path, and these have dimensions that differ from the layout parameters. FIG. 2B, for example, illustrates DC blocking capacitors 114a, 114b on the differential signal traces 102a, 102b. Signals may have to traverse connectors, which add to the difficulties.

Figure 2C:
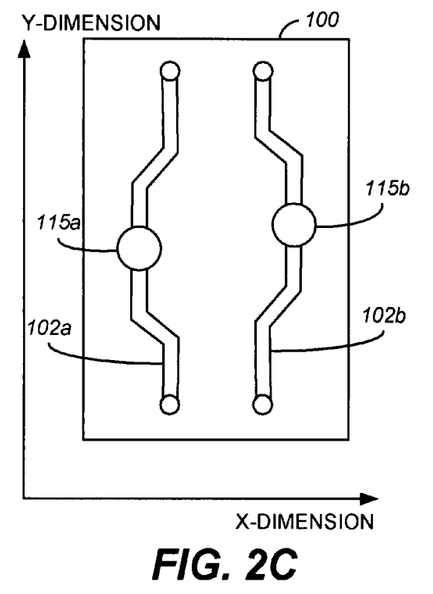
FIG. 2C is a top view of a printed circuit board showing the x- and y-dimensions in the x-, y-, z-coordinate system of a pair of differential signal traces with symmetrically arranged test access point pads.
Figure 2D:
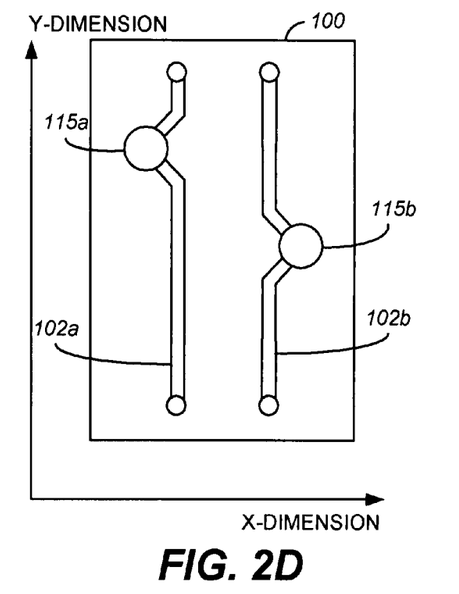
FIG. 2D is a top view of a printed circuit board showing the x- and y-dimensions in the x-, y-, z-coordinate system of a pair of differential signal traces with asymmetrically arranged test access point pads.
Figure 2E:
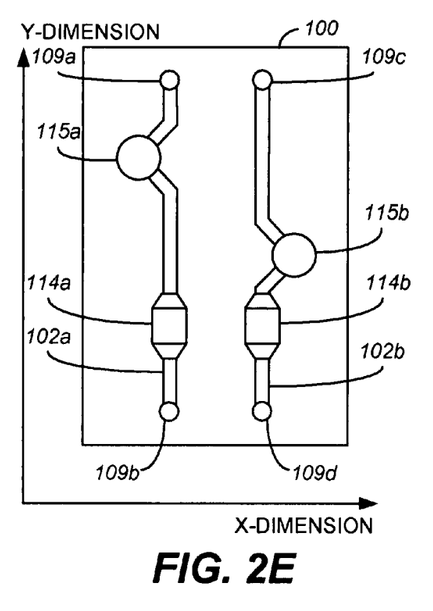
FIG. 2E is a top view of a printed circuit board showing the x- and y-dimensions in the x-, y-, z-coordinate system of a pair of differential signal traces with capacitors with asymmetrically arranged test access point pads.
Figure 2F:
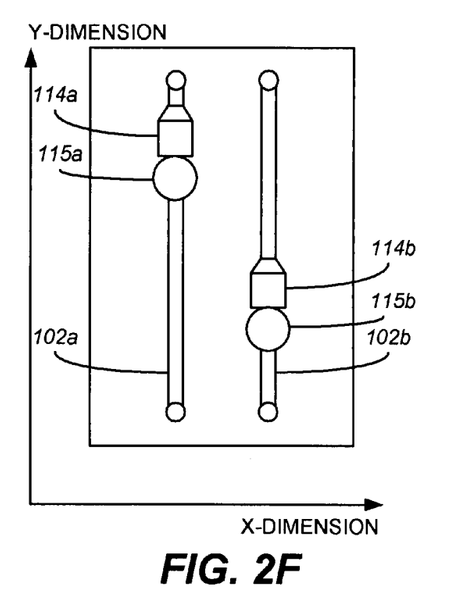
FIG. 2F is a top view of a printed circuit board showing the x- and y-dimensions in the x-, y-, z-coordinate system of a pair of differential signal traces with capacitors having test access point pads integral to the capacitors.

Additional difficulties arise when testing is considered. Testing requires tester access to circuit traces at particular probe targets. Layout rules typically require test targets to be at least 50 mils apart and may require the diameter of the test point targets to greatly exceed the width of the traces. FIG. 2C illustrates test targets 115a, 115b symmetrically positioned 50 mils apart on the differential signal traces 102a, 102b. FIG. 2D illustrates test targets 115a, 115b arranged asymmetrically, but at least 50 mils apart, on the differential signal traces 102a, 102b. FIG. 2E illustrates test targets 115a, 115b arranged asymmetrically from the DC blocking capacitors 114a, 114b but at least 50 mils apart on the differential signal traces 102a, 102b, and FIG. 2F illustrates the test targets 115a, 115b implemented on the capacitors 114a, 114b themselves, requiring asymmetrical positioning of the capacitors on the differential signal traces 102a, 102b.

The positioning of test targets 102a, 102b can be problematic. In many cases the need to keep a minimum separation between targets (typically 50 mils, minimum) is in direct conflict with controlled impedance layout rules. These conflicts lead to either a compromise in controlled impedance integrity, or a forced reduction in target placement with a resulting reduction in testability. As signal speeds continue to rise, this problem will only get worse.

SUMMARY OF THE INVENTION

The present invention solves the conflict problems faced by traditional techniques for test access point placement on printed circuit boards by minimizing the perturbations of traces in the x- and y-dimensions and taking advantage of the z-dimension. In particular, the invention utilizes trace thickness to implement test access points, thereby allowing test access point placement anywhere along the trace. This in turn allows the ability to design printed circuit boards with test access point placement according to the positions of fixture probes of a given test fixture, rather than vice versa as in the prior art.

In one preferred embodiment solder beads are conductively connected to the top surfaces of traces where test access points are desired. In this embodiment, after the traces are printed or otherwise deposited on the dielectric, a solder mask having holes where test access points are desired is deposited over the exposed surfaces of the traces and underlying dielectric. The solder mask is then covered with solder paste, filling any holes in the mask. The solder paste is made up of solder and flux. The solder paste is then heated to burn off the flux, causing the solder to retract from the walls of the holes and to form solder beads that project above the walls of their respective holes. The dimensions of the solder mask holes determine the final diameter of the solder beads. Accordingly, test access point structures can be implemented directly along the trace, yet have a large enough diameter to be probed and still meet board layout requirements.

In the preferred embodiment, the test access point structure is non-integral to the trace and is added to the trace after the trace has been printed on the printed circuit board. In an alternative embodiment, the test access point structure may be implemented integral to the trace and is formed during formation of the trace itself.

To compensate for any undesired secondary effects on the impedance of the trace at the test access point due to the test access point structure, the width of the trace at the test access point may be reduced.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Turning now in detail to the invention, on a trace defined in an x-, y-, z-coordinate system where the x-dimension represents the trace width, the y-dimension represents the trace length, and the z-dimension represents the trace thickness, it will be recognized by those skilled in the art that present techniques for test access point placement on a printed circuit board utilize only the x- and y-dimensions. The present invention takes a different approach by taking advantage of the z-dimension, that is, the trace thickness. In this regard, the test access point structure of the invention is a localized "high point" on a printed circuit board trace that does not significantly perturb the impedance of the trace and that can be targeted with a probe.

Figure 3A:
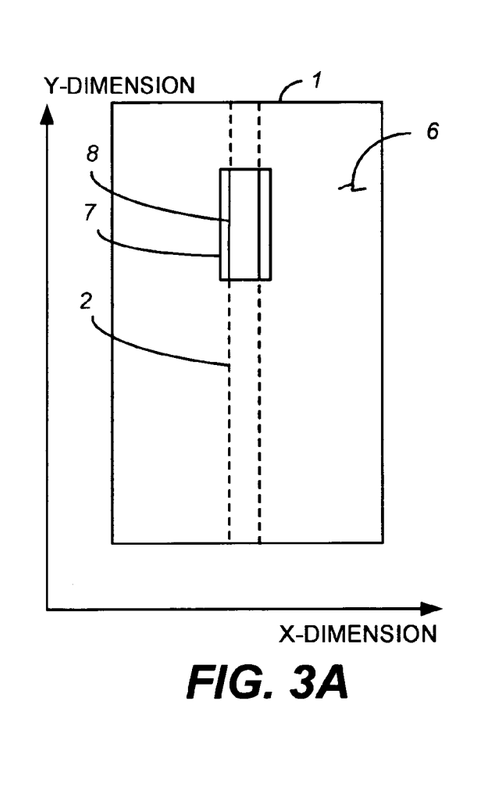
FIG. 3A is a top view of a portion of a printed circuit board showing the x- and y-dimensions in the x-, y-, z-coordinate system of a trace with a test access point structure implemented in accordance with the principles of the invention.
Figure 3B:
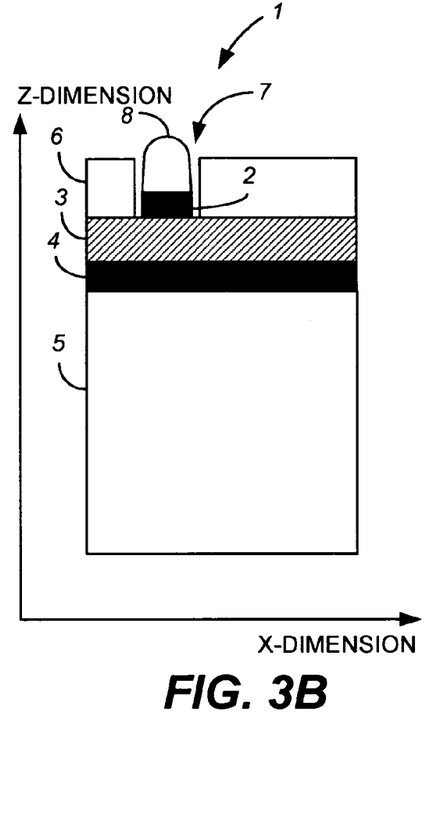
FIG. 3B is a cross-sectional side view showing the x- and z-dimensions in the x-, y-, z-coordinate system of the portion of the printed circuit board and trace of FIG. 3A.
Figure 3C:
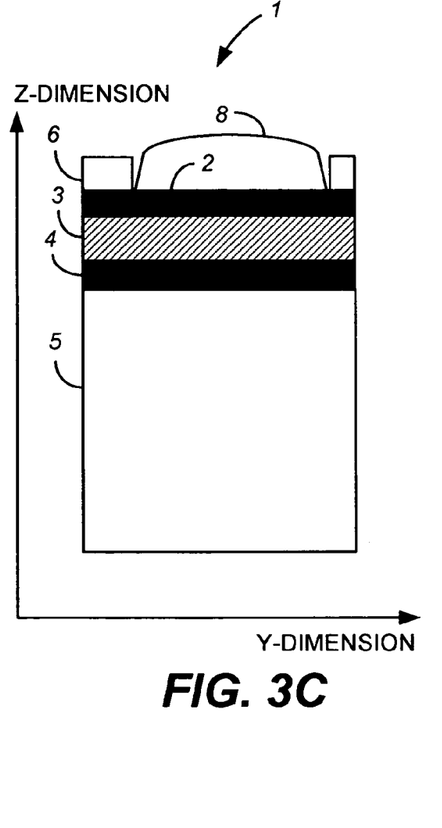
FIG. 3C is a cross-sectional side view of the portion of the printed circuit board and trace of FIGS. 3A and 3B showing the y- and z-dimensions in the x-, y-, z-coordinate system.

FIGS. 3A-3C illustrate an exemplary embodiment of a test access point structure implemented in accordance with the invention. As shown in FIGS. 3A-3C, a printed circuit board 1 includes a substrate 5, a ground plane 4, and at least one dielectric layer 3 with a trace 2 printed, deposited, or otherwise attached thereon. A solder mask 6 with a hole 7 formed over the trace 2 at a location where a test access point structure 8 is positioned is layered over the exposed surfaces of the dielectric layer 3 and trace layer 2. A test access point structure 8 is conductively attached to the trace 2 within the solder mask hole 7 at the test access point. The test access point structure 8 projects above the exposed surrounding surfaces of the solder mask 6 to form an exposed localized high point on the trace 2 that may be used as a test target by a fixture probe during testing of the printed circuit board 1. In the preferred embodiment, the test access point structure 8 is a solder bead with a length (in the y-dimension) larger than the width (in the x-dimension) of the trace to provide maximum probe access success.

In a preferred method of manufacture of the test access point structures 8, the invention utilizes existing printed circuit board fabrication processes, thereby keeping costs low. As known in the art, virtually every printed circuit board is constructed with high-speed signals appearing on the outer layers due to the ability to more easily control impedances on the outer layers. The two outer layers are also typically coated with a solder mask that is used to assure that only exposed copper (or other conductive materials) areas will retain solder paste that is applied via a screen printing process. Holes in the solder mask assure that only those areas of copper that should be soldered with receive solder paste.

Figure 4:
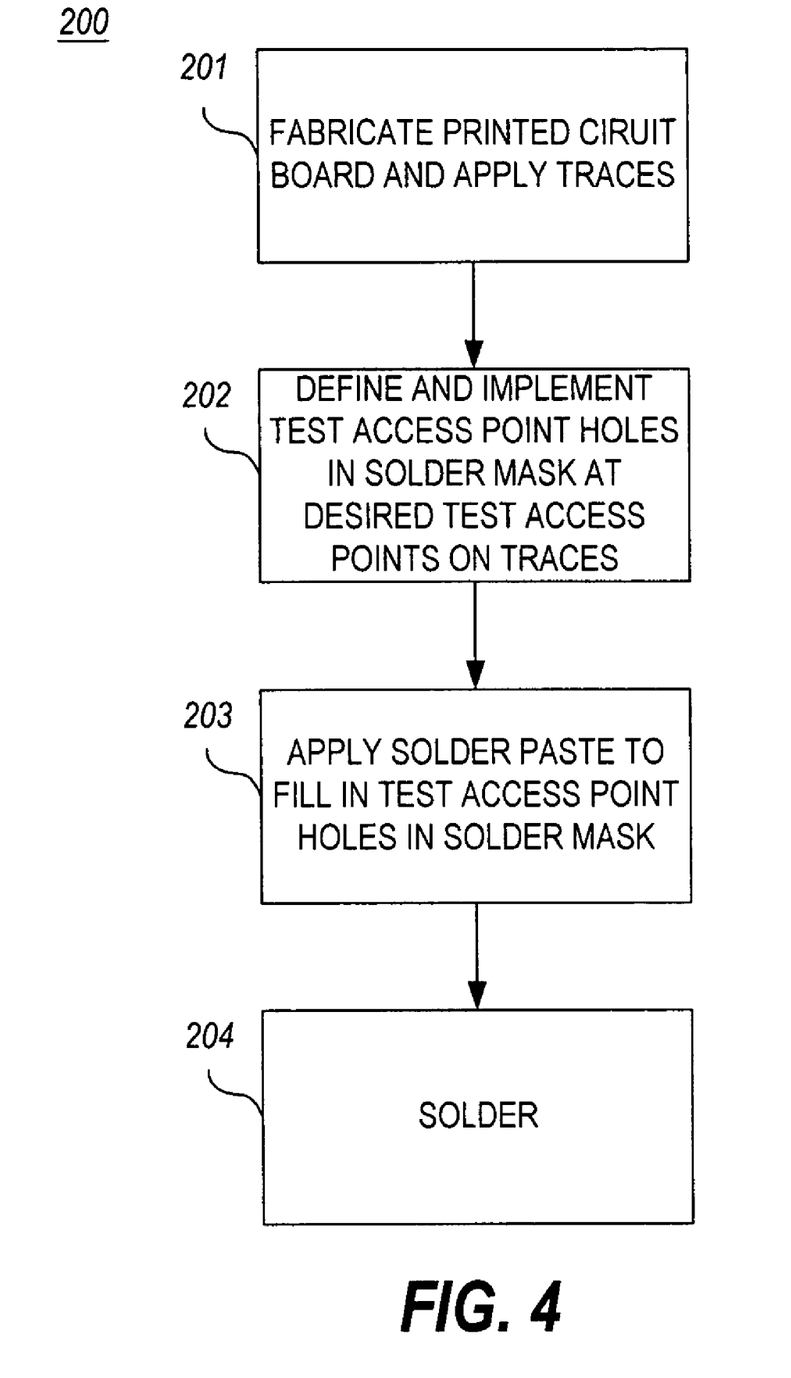
FIG. 4 is an operational flowchart illustrating a preferred method of manufacture of a test access point structure of the invention on a trace of a printed circuit board.
Figure 5A:
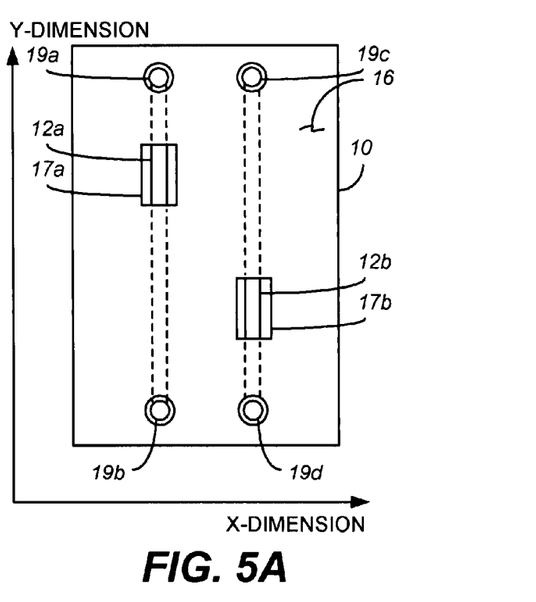
FIG. 5A is a top view of a portion of a printed circuit board showing the x- and y-dimensions in the x-, y-, z-coordinate system of a pair of differential traces with test access point structures implemented according to the method of FIG. 4.
Figure 5B:
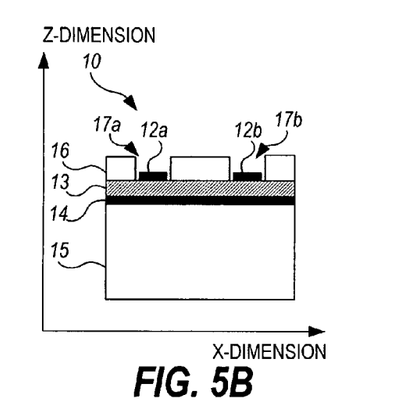
FIG. 5B is a cross-sectional side view showing the x- and z-dimensions in the x-, y-, z-coordinate system of the portion of the printed circuit board and trace of FIG. 5A after application of the solder mask but prior to application of solder paste.
Figure 5C:
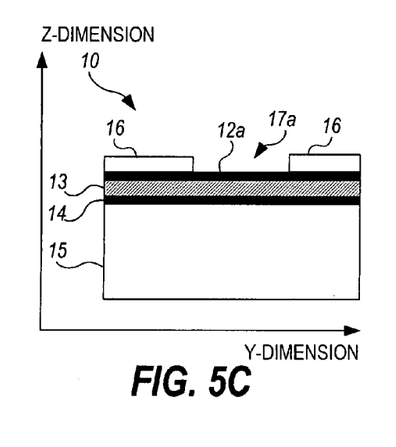
FIG. 5C is a cross-sectional side view showing the y- and z-dimensions in the x-, y-, z-coordinate system of the portion of the printed circuit board and trace of FIGS. 5A and 5B after application of the solder mask but prior to application of solder paste.
Figure 5D:
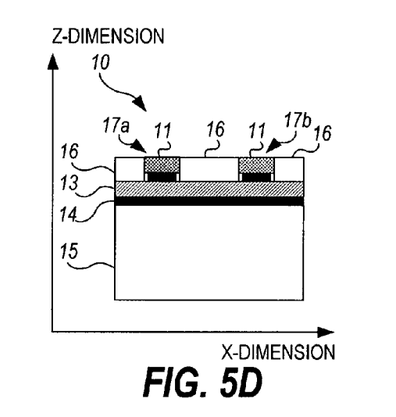
FIG. 5D is a cross-sectional side view showing the x- and z-dimensions in the x-, y-, z-coordinate system of the portion of the printed circuit board and trace of FIGS. 5A-5C after application of solder paste.
Figure 5E:
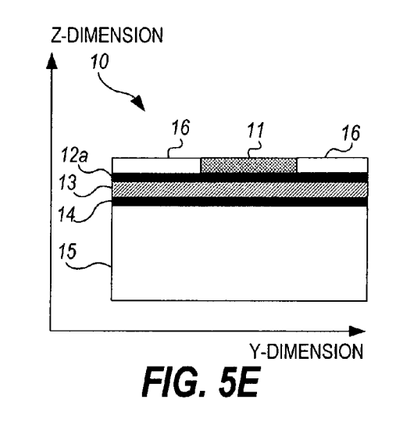
FIG. 5E is a cross-sectional side view showing the y- and z-dimensions in the x-, y-, z-coordinate system of the portion of the printed circuit board and trace of FIGS. 5A-5D after application of solder paste.

FIG. 4 is an operational flowchart illustrating a preferred method 200 of manufacture of a test access point structure on a trace of a printed circuit board, and FIGS. 5A-5G include various views of a portion of a printed circuit board 10 during manufacture of the test access point structure 18a, 18b in accordance with the method of FIG. 4. Referring now to FIG. 4 with additional reference to FIGS. 5A-5G, in the preferred method of manufacture of the test access point structures of the invention, the printed circuit board 10 is fabricated in step 201 to the point of printing, depositing, or otherwise layering the traces 12a, 12b on which test access point structures 18a, 18b are to be implemented. In step 202, test access point holes 17a, 17b (in addition to holes, 19a, 19b, 19c, 19d for the traditional points of solder—e.g., component pin-to-trace solder points) are defined and implemented in the printed circuit board solder mask 16 in locations over traces 12a, 12b at desired test access points, as illustrated in FIGS. 5A, 5B, and 5C. The test access point holes 17a, 17b are designed to be fractionally larger than the width of their respective traces 12a, 12b and may stretch three to ten or more times longer than they are wide. By designing the test access point holes 17a, 17b to be only fractionally larger than their respective trace widths, as shown by hole 17a and trace 12a in FIG. 5B, the trace width dimensions themselves are not affected, which allows test access point placement to be determined after the board layout is concluded. The positions of the test access point holes 17a, 17b in the solder mask 16 are governed by rules on minimum probe spacing and proximity to other devices that must be avoided.

Once the test access point holes 17a, 17b are located and the solder mask 16 is produced, printed circuit board fabrication proceeds as is normal in the art. To this end, in step 203, solder paste 11 is applied to the board 10, thereby filling the solder mask holes 17a, 17b, using the standard well-known silk-screen process, as illustrated in hole 17a in FIGS. 5D and 5E. The area of the hole 17a determines the volume of solder paste 11 that ends up in the hole 17a.

Figure 5F:
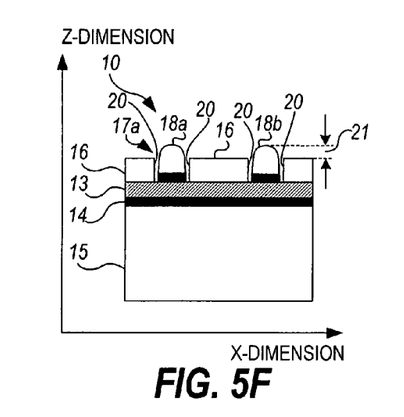
FIG. 5F is a cross-sectional side view showing the x- and z-dimensions in the x-, y-, z-coordinate system of the portion of the printed circuit board and trace of FIGS. 5A-5E after soldering.
Figure 5G:
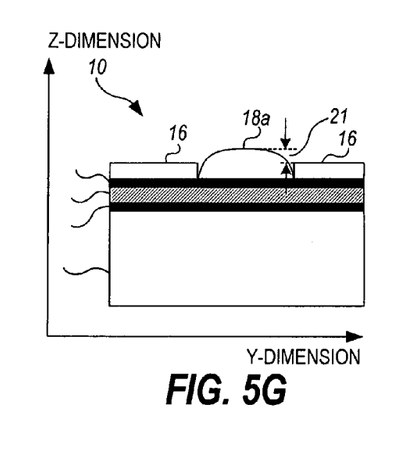
FIG. 5G is a cross-sectional side view showing the y- and z-dimensions in the x-, y-, z-coordinate system of the portion of the printed circuit board and trace of FIGS. 5A-5F after soldering.

In step 204, the solder paste is soldered to the conductive areas exposed by the solder mask, for example using a reflow soldering technique. Soldering is a very well-understood process. As known in the art, the solder paste is approximately 90% metal and 10% flux. When the solder paste melts during reflow soldering, the flux burns off, preventing oxidation of the solder and reducing the end volume. Surface tension causes the paste to reform from a rectilinear shape, as defined by the mask hole, into a semi-spheroidal shape defined by the exposed copper. Thus, the melted solder will retract from the walls 20 of the test access point hole 17a in the solder mask 16 and form a bead 18, as illustrated in FIGS. 5F and 5G that can project some distance 21 above the solder mask 16. This distance, or test access point structure thickness 21 in the z-dimension of the x-, y-, z-coordinate system, is determined by the area of the exposed trace 12a, 12b and the original volume of the solder paste 11.

Figure 6A:
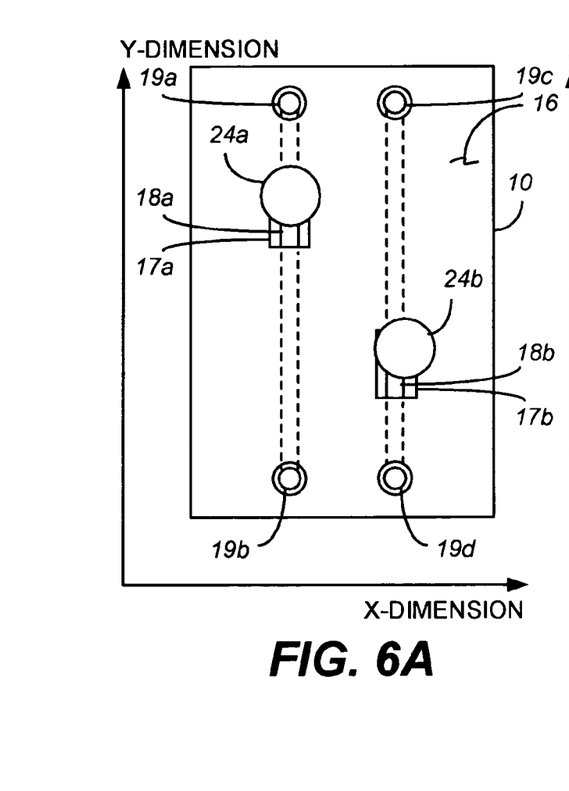
FIG. 6A is a top view of a portion of a printed circuit board showing the x- and y-dimensions in the x-, y-, z-coordinate system of a pair of test access points implemented on differential traces of a printed circuit board and a corresponding pair of circular test probes illustrating probe-to-TAP contact even with misalignments of probe centers.
Figure 6B:
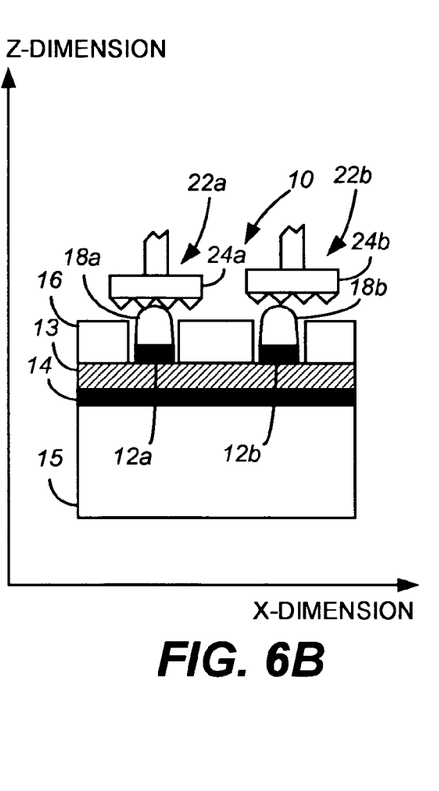
FIG. 6B is a cross-sectional side view showing the x- and z-dimensions in the x-, y-, z-coordinate system of the portion of the printed circuit board and probes of FIG. 6A.
Figure 6C:
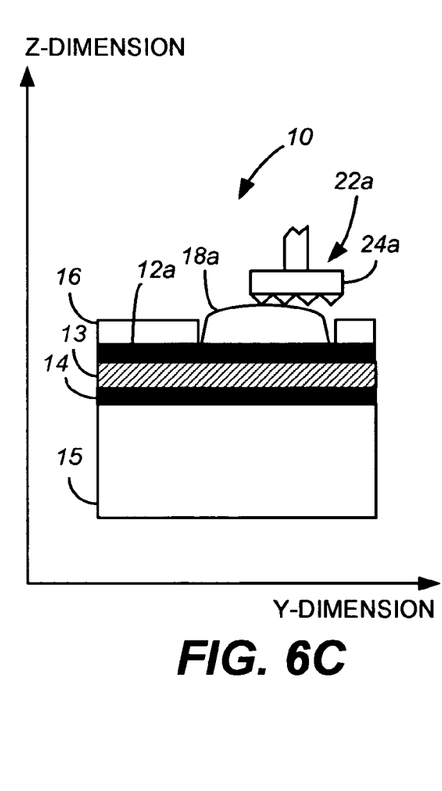
FIG. 6C is a cross-sectional side view showing the y- and z-dimensions in the x-, y-, z-coordinate system of the portion of the printed circuit board and probes of FIGS. 6A-6B.

Once the locations of the test access point structures has been determined, an ICT fixture can be designed with positioning of circular test probes 22a, 22b, as illustrated in FIGS. 6A, 6B, and 6C, such as to ensure that the test access point structures 18a, 18b (in this embodiment, solder beads) will be hit even with the expected misalignments of probe centers. The area of the probe heads 24a, 24b may be made larger than typical test target areas (28-35 mils) to enhance probing success, limited by probe density and proximity of nearby devices that must not be touched.

Figure 7:
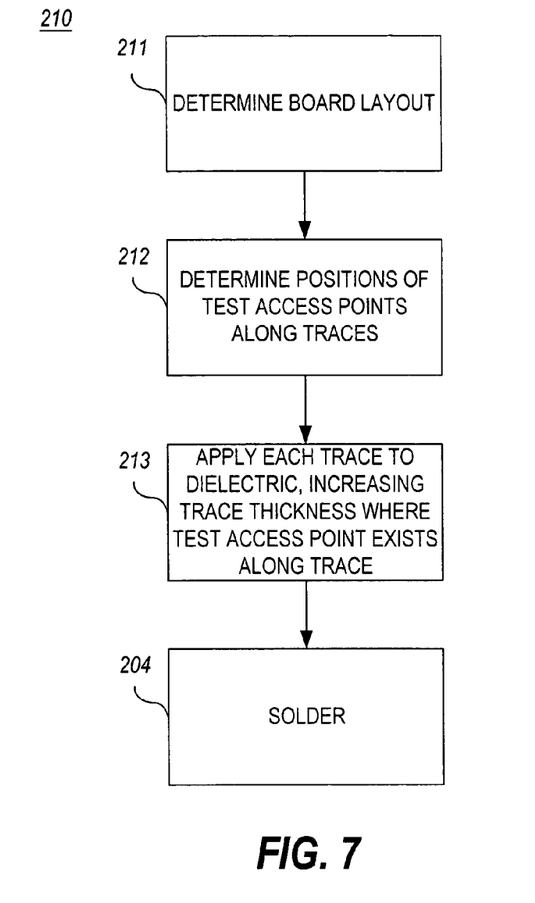
FIG. 7 is an operational flowchart illustrating an alternative preferred method of manufacture of a test access point structure of the invention on a trace of a printed circuit board.

In an alternative embodiment to the solder bead test access point structure, the thickness of the trace itself can be increased in predetermined test access point locations during the trace printing process. FIG. 7 illustrates a method 210 in accordance with this alternative embodiment for fabricating test access point structures. As illustrated, once the board layout is determined in step 211, test access point locations along the traces are then determined in step 212. During manufacture of the printed circuit board, in step 213 the traces are printed, deposited, or otherwise layered on top of a dielectric layer. For each test access point location on a given trace, the thickness of the trace material is increased at that location.

Figure 8A:
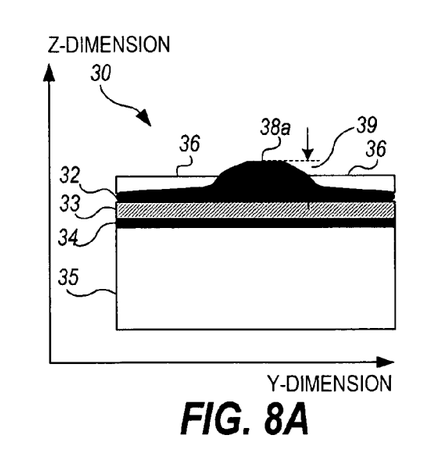
FIG. 8A is a cross-sectional view of a portion of a printed circuit board showing the y- and z-dimensions in the x-, y-, z-coordinate system of a test access point implemented in accordance with the method of FIG. 7.
Figure 8B:
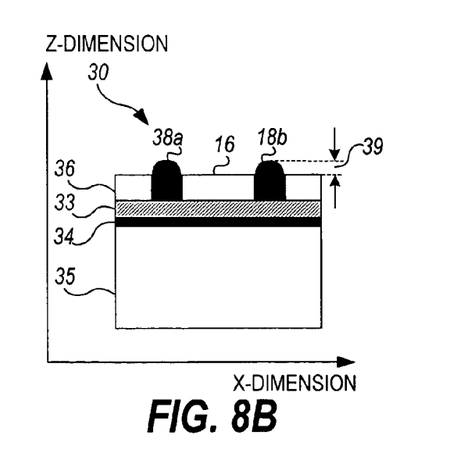
FIG. 8B is a cross-sectional view of a portion of a printed circuit board showing the x- and z-dimensions in the x-, y-, z-coordinate system of a test access point implemented in accordance with the method of FIG. 7.

FIG. 8A shows the y- and z-dimensions, and FIG. 8B shows the x- and z-dimensions in the x-, y-, z-coordinate system of a pair of differential signal traces implemented in accordance with the method of FIG. 7 for fabricating test access point structures. The printed circuit board 30 includes substrate 35, overlaid by ground plane 34, overlaid by at least one pair of dielectric 33 and trace layers 32. The exposed trace layer 32 is thicker at test access point locations where test access point structure 38a, 38b are implemented. The test access point structures 38a, 38b project a predetermined thickness 39 above a solder mask layer 36. As illustrated in FIG. 8A, the trace layer 32 gradually becomes thicker as it approaches the location of the test access point structure 38a in both directions along the y-axis where it reaches a localized "thick" point, which embodies the test access point structure 38a.

An enhancement to the invention for ensuring that the test access point structures do not result in undesired secondary effects on the trace impedance at the test access points due to the change in apparent thickness of the trace in a localized area is to coordinate changes to the trace layout with the placement of the test access point structures. Several controllable factors exist in the layout that can be used to mitigate the impedance "bump" due to the test access point structure. These factors include the width and the spacing of the traces. For example, the trace width can be narrowed in the localized region of the test access point structure location. The narrowing of the trace would normally increase the inductance and reduce the capacitance of the trace. However, since the test access point structure would have the opposite effect, the change in trace shape operates to compensate for the changes due to the test access point structure in that localized area of the trace.

Figure 9A:
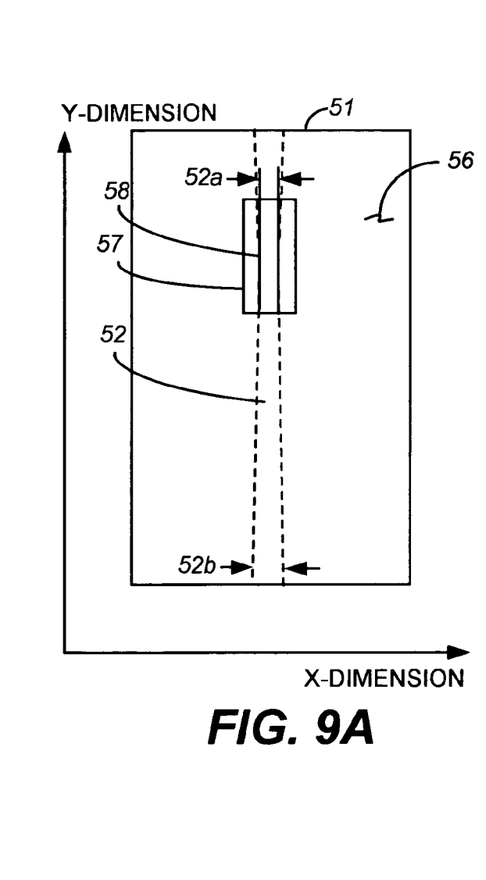
FIG. 9A is a top view of a portion of a printed circuit board showing the x- and y-dimensions in the x-, y-, z-coordinate system of an alternative embodiment of a pair of test access points using trace narrowing to compensate for the change in transmission line characteristics due to the addition of the test access point structures.
Figure 9B:
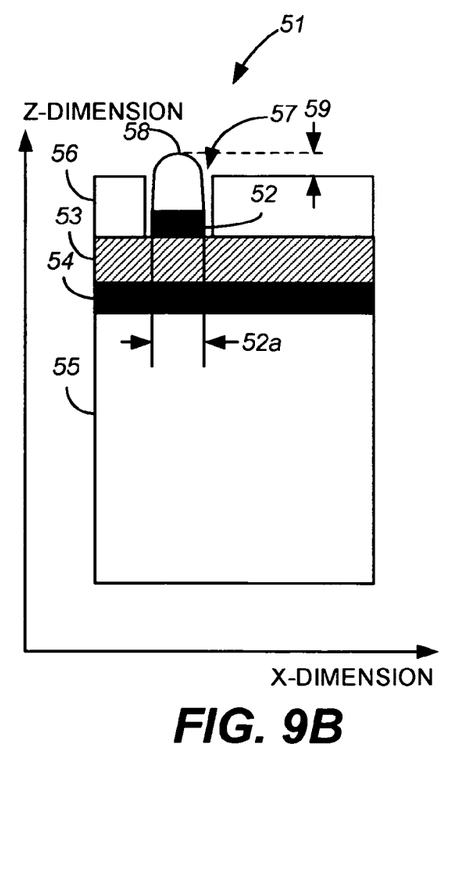
FIG. 9B is a cross-sectional side view showing the x- and z-dimensions in the x-, y-, z-coordinate system of the portion of the printed circuit board of FIG. 9A.
Figure 9C:
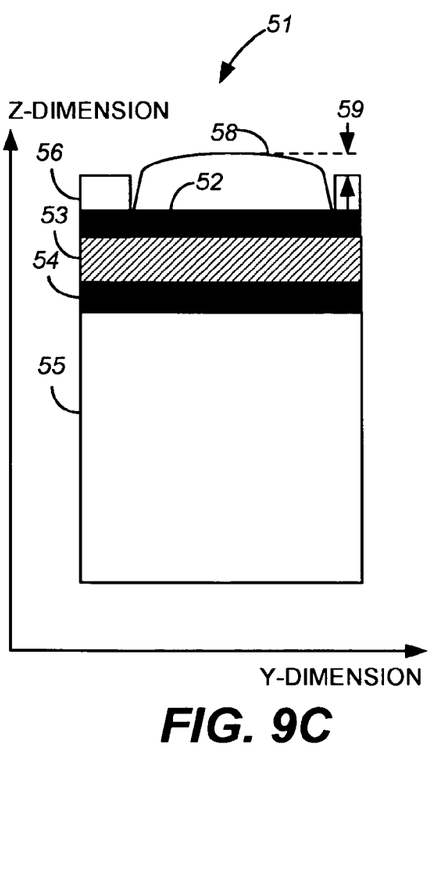
FIG. 9C is a cross-sectional side view showing the y- and z-dimensions in the x-, y-, z-coordinate system of the portion of the printed circuit board of FIGS. 9A-9B.

One embodiment of trace width narrowing in areas of test access point structures is as illustrated in FIGS. 9A, 9B, and 9C. As shown therein, the printed circuit board 50 includes substrate 55, overlaid by ground plane 54, overlaid by at least one pair of dielectric 53 and trace layers 52. The top trace layer 52 and exposed surfaces of the dielectric 53 are overlaid by a solder mask 56 with a hole 57 where a test access point structure 58 is located. In this embodiment, the trace thickness is substantially constant, and test access point structure is implemented using the solder beading process described in conjunction with FIGS. 4, and 5A-5G. In this embodiment, however, the width 52a of the trace 52 is narrowed, as shown in FIGS. 9A and 9B, in test access point locations and returned to a substantially constant width 52b in places where no test access point structure is attached to the trace 52. Thus, the narrowing of the trace at the test access point location operates to compensate for the changes in impedance, capacitance, and inductance due to the test access point structure in that localized area of the test access point location.

Figure 10A:
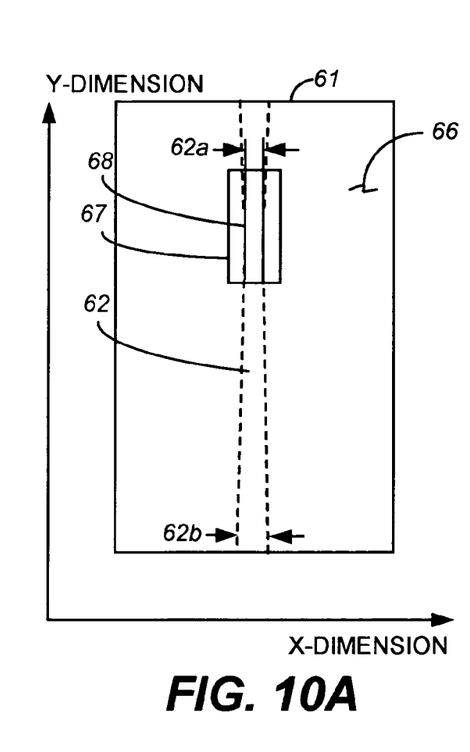
FIG. 10A is a top view of a portion of a printed circuit board showing the x- and y-dimensions in the x-, y-, z-coordinate system of another alternative embodiment of a pair of test access points using trace narrowing to compensate for the change in transmission line characteristics due to the addition of the test access point structures.
Figure 10B:
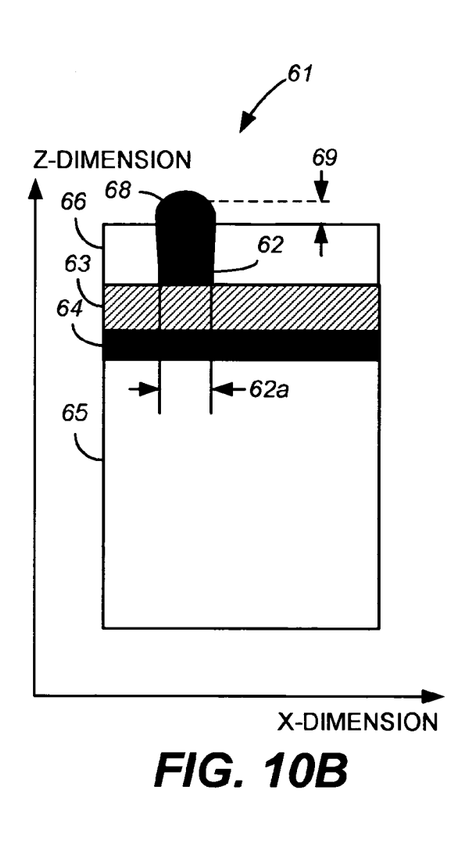
FIG. 10B is a cross-sectional side view showing the x- and z-dimensions in the x-, y-, z-coordinate system of the portion of the printed circuit board of FIG. 10A.
Figure 10C:
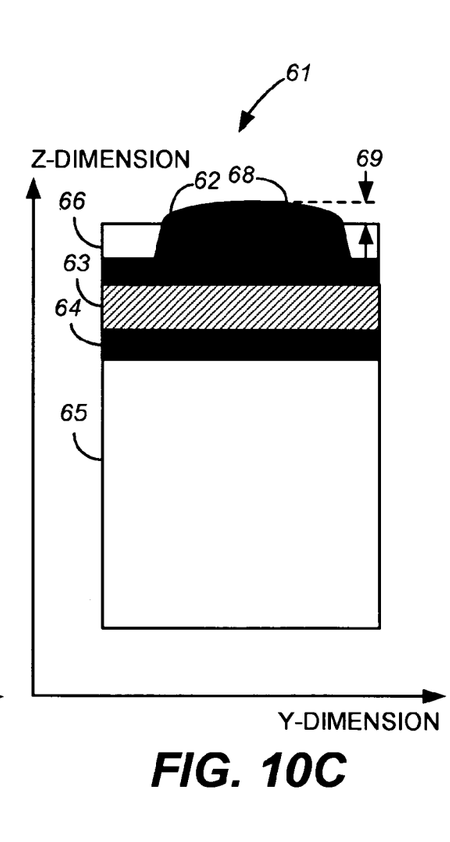
FIG. 10C is a cross-sectional side view showing the y- and z-dimensions in the x-, y-, z-coordinate system of the portion of the printed circuit board of FIGS. 10A-10B.

Another embodiment of trace width narrowing in areas of test access point structures is as illustrated in FIGS. 10A, 10B, and 10C. As shown therein, the printed circuit board 60 includes substrate 65, overlaid by ground plane 64, overlaid by at least one pair of dielectric 63 and trace layers 62. The top trace layer 62 and exposed surfaces of the dielectric 63 are overlaid by a solder mask 66 with a hole 67 where a test access point structure 68 is located. In this embodiment, the trace thickness 67 is substantially constant in areas where no test access point structure is implemented, and increases in at locations of test access point structures. The test access point structure 68 is implemented using the process described in conjunction with FIGS. 7, 8A, and 8B. In this embodiment, however, the width 62a of the trace 62 is narrowed, as shown in FIGS. 10A and 10B, in test access point locations and returned to a substantially constant width 62b and thickness 67 in places where no test access point structure is attached to the trace 62. Thus, the narrowing of the trace at the test access point location operates to compensate for the changes in impedance, capacitance, and inductance due to the test access point structure in that localized area of the test access point location.

It will be appreciated from the above detailed description of the invention that the present invention uniquely solves the conflict problems faced by traditional techniques for test access point placement on printed circuit boards. In particular, in the prior art paradigm, test access points are treated as "targets" on a printed circuit board that are hit by probes. In the new paradigm as presented herein, the probes are integrated into the printed circuit board itself using solder beads or increased trace thickness, and the fixture probes are treated as the targets. Since in the invention the perturbations of traces in the x- and y-dimensions are minimized, and the z-dimension of the trace is utilized to implement test access points, test access points may be placed almost anywhere along the trace. This allows the placement decision of the test access points on the board to be made according to the locations of the fixture probes of a given test fixture rather than vice versa as done in the prior art.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A test access point structure on a printed circuit board, comprising:
   a trace printed along an x-y plane in an x-, y-, z-coordinate system of a dielectric, said trace generally characterized by a trace thickness along a z axis perpendicular to an x-y plane of said dielectric; and
   a test access point structure conductively connected to said trace at a test access point, said test access point structure projecting along a z axis in an x-, y-, z-coordinate system above an exposed surface of said printed circuit board to be accessible for electrical probing by an external device;
   wherein said trace is further characterized by a substantially constant trace width leading up to said test access point and a narrower trace width that is narrower than said substantially constant trace width at said test access point.

2. A test access point in accordance with claim 1, wherein said test access point comprises a solder bead.

3. A test access point in accordance with claim 1, wherein said test access point is formed integral to said trace and characterized by an increase in thickness at said test access point.

4. A test access point in accordance with claim 1, further comprising:
   a solder mask layered over said trace, said solder mask having a hole exposing said test access point structure, wherein said test access point structure projects along said z axis of said x-, y-, z-coordinate system above an exposed surface of said solder mask on said printed circuit board to be accessible for electrical probing by said external device.

5. A test access point in accordance with claim 4, wherein said test access point comprises a solder bead/bump.

6. A test access point in accordance with claim 4, wherein said test access point is formed integral to said trace and characterized by an increase in thickness at said test access point.

* * * * *